United States Patent
Nguyen et al.

(10) Patent No.: US 9,281,167 B2
(45) Date of Patent: Mar. 8, 2016

(54) VARIABLE RADIUS DUAL MAGNETRON

(71) Applicant: Applied Materials, Inc., Santa Clara, CA (US)

(72) Inventors: Thanh X Nguyen, San Jose, CA (US); Rongjun Wang, Dublin, CA (US); Muhammad M Rasheed, San Jose, CA (US); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 489 days.

(21) Appl. No.: 13/777,010

(22) Filed: Feb. 26, 2013

(65) Prior Publication Data

US 2014/0238843 A1    Aug. 28, 2014

(51) Int. Cl.
*C23C 14/35* (2006.01)
*H01J 37/34* (2006.01)
*H01J 37/32* (2006.01)
*C23C 14/56* (2006.01)

(52) U.S. Cl.
CPC ............. *H01J 37/3408* (2013.01); *C23C 14/35* (2013.01); *C23C 14/564* (2013.01); *H01J 37/3288* (2013.01); *H01J 37/3405* (2013.01); *H01J 37/3452* (2013.01); *H01J 37/3455* (2013.01); *H01J 37/3476* (2013.01)

(58) Field of Classification Search
CPC ... C23C 14/35; C23C 14/564; H01J 37/3288; H01J 37/3405; H01J 37/3408; H01J 37/3452; H01J 37/3455; H01J 37/3476
USPC ......................... 204/298.2, 192.12
See application file for complete search history.

(56) References Cited

U.S. PATENT DOCUMENTS

| | | |
|---|---|---|
| 5,284,564 A | 2/1994 | Maass |
| 6,228,236 B1 | 5/2001 | Rosenstein et al. |
| 7,736,473 B2 | 6/2010 | Miller et al. |
| 7,767,064 B2 | 8/2010 | Pavloff et al. |
| 8,021,527 B2 | 9/2011 | Miller et al. |
| 2006/0076235 A1 | 4/2006 | Wei |
| 2006/0191876 A1 | 8/2006 | Brown et al. |
| 2007/0089983 A1 | 4/2007 | Plaisted et al. |
| 2010/0252417 A1 | 10/2010 | Allen et al. |
| 2011/0036709 A1 | 2/2011 | Hawrylchak et al. |
| 2011/0297538 A1 | 12/2011 | Miller et al. |
| 2011/0311735 A1 | 12/2011 | Wang et al. |
| 2012/0048724 A1 | 3/2012 | McLeod |

OTHER PUBLICATIONS

International Search Report, PCT/US14/12733, Apr. 17, 2014.
International Preliminary Report on Patentability, PCT/US2014/012733.

*Primary Examiner* — Rodney McDonald
(74) *Attorney, Agent, or Firm* — Charles S. Guenzer

(57) ABSTRACT

A dual magnetron particularly useful for RF plasma sputtering includes a radially stationary open-loop magnetron comprising opposed magnetic poles and rotating about a central axis to scan an outer region of a sputter target and a radially movable open-loop magnetron comprising opposed magnetic poles and rotating together with the stationary magnetron. During processing, the movable magnetron is radially positioned in the outer region with an open end abutting an open end of the stationary magnetron to form a single open-loop magnetron. During cleaning, part of the movable magnetron is moved radially inwardly to scan and clean an inner region of the target not scanned by the stationary magnetron. The movable magnetron can be mounted on an arm pivoting about an axis at periphery of a rotating disk-shaped plate mounting the stationary magnetron so the arm centrifugally moves between radial positions dependent upon the rotation rate or direction.

19 Claims, 3 Drawing Sheets

VARIABLE RADIUS DUAL MAGNETRON

FIELD OF THE INVENTION

The invention relates generally to plasma sputtering in the fabrication of integrated circuits. In particular, the invention relates to a magnetron rotating about a back of a sputtering target.

BACKGROUND ART

Sputtering, alternatively called physical vapor deposition, is widely used to deposit layers of target material on a wafer or other substrate. Plasma sputtering is most often used in the fabrication of electronic integrated circuits. A plasma, typically formed of an inactive working gas, is formed adjacent to the target and plasma ions are electrically attracted to the target at sufficient energy to dislodge or sputter target atoms from the target which then deposit on the wafer in opposition to the target. A magnet assembly, most often called a magnetron, is usually placed in back of the target to create a magnetic field adjacent and parallel to the front face of the target. The magnetic field traps electrons and thereby increases the density of the plasma and hence the sputtering rate.

In the recent past, sputtering in commercial production has largely involved sputtering of highly conductive metals, such as aluminum, copper, and titanium, to form electrical interconnects and refractory barrier layers. In these applications, a DC electrical potential has been conventionally applied to the target and the magnetron typically has nested magnetic poles of an outer pole of one magnetic polarity surrounding an inner pole of the opposed magnetic polarity and separated from it by an annular gap. The magnetic field between the two poles forms a magnetic tunnel which supports and guides plasma current in a closed loop, thereby forming a dense plasma. Advantageously, the magnetron is made relatively small to increase the local plasma density, but the magnetron then needs to be rotated about the back of the target to produce more uniform sputtering.

In many application involving very high plasma densities and ionized sputtered atoms, the small magnetron is positioned near the outer periphery of the target and rotated about the target center so that the sputtered ions diffuse toward the central axis to produce a more uniform deposition on the wafer. As a result, the target center is not being significantly sputtered and instead some of the sputtered atoms redeposit on the central area of the target. In other configurations, the target center is sputtered and the outer regions of the target are subject to redeposition. Such redeposited material is not stable and is likely to produce deleterious particles which falls on the wafer and create defects, thereby reducing the yield of operable integrated circuit dies.

To minimize problems from redeposition, a magnetron can be moved from one radius on the target at which a production wafer is being coated to another radius at which redeposited portions of the target are being cleaned with no production wafer being present. See, for example, U.S. Pat. No. 6,228,236 to Rosenstein et al., U.S. Pat. No. 7,736,473 to Miller et al., and U.S. Pat. No. 7,767,064 to Pavloff et al. In U.S. Pat. No. 8,021,527, Miller et al. describe a more general mechanism for varying a magnetron radius while it is azimuthally rotating about the target center. These patents are incorporated herein by reference for alternative mechanisms for radially moving all or part of a magnetron.

Although the technology dates back many decades, RF (radio frequency) sputtering has been recently promoted for sputtering into very narrow holes, such as vias, to achieve reasonable step coverage so that the material is deposited deep within and on the sides of the hole. See US patent application publication 2010/0252417 to Allen et al. RF sputtering benefits from a significantly different magnetron than that used in DC sputtering. In one embodiment, the magnetron is formed by a relatively large magnet assemblies of two opposed and spaced poles arc-shaped in large segments about the rotation axis and having open ends rather than a closed shape. The open-ended shape may be described as an open loop versus the closed loop of conventional DC magnetron. The present inventors believe that such an open-loop magnetron leaks plasma out of the ends of the magnetron to thereby increase the depth and volume of the plasma so that neutral metal atoms sputtered from the target are more likely to be ionized as they traverse the plasma in their trajectory to the wafer. Sputtered metal ions are particularly beneficial for bottom coverage in vias of high aspect ratio when the wafer is negatively biased.

Wang et al. in US patent application publication 2011/01311735 suggest a magnetron having a spiral shape about the target center with a varying gap between the poles of the magnetron.

Allen et al. in the previously cited publication have recognized the need to clean the inner portion of the target and have described an embodiment of a magnetron formed in a partial circle about the rotation axis during sputter deposition processing which can be pivoted inwardly to cross most of the diameter of the target during target cleaning.

SUMMARY OF THE INVENTION

A dual magnetron is rotationally or azimuthally scanned about the center of the target during plasma sputtering, especially of a low-resistivity material such as silicon or dielectrics such as $Al_2O_3$. The dual magnetron includes a radially stationary magnetron positioned near the periphery of the target and preferably extending partially radially inwardly in a spiral pattern and a radially movable magnetron movable between the target periphery during process sputtering and an inner portion of the target not scanned by the stationary magnetron during target cleaning.

Both the stationary and movable magnetrons may be composed of opposed magnetic poles separated by a gap and extending along a gently curving path with open ends to support a plasma track formed in an open loop. During process sputtering, the two magnetrons are linearly adjacent to support a single, combined plasma track. In one embodiment, during cleaning, the adjacent ends of the two magnetrons radially separate to thereby also separate the plasma tracks.

The dual magnetron may be formed on a rotating plate rotatable about the central axis of the chamber and its target and fixedly supporting the stationary magnetron and pivotally supporting an arm fixedly supporting the movable magnetron. In one embodiment, the arm freely pivots about a pivot axis near the periphery of the rotating plate. When the plate rotates in one direction, centrifugal force pushes the free end of the arm and its movable magnetron to the periphery of the rotating plate. When the plate rotates in the other direction, centrifugal forces pushes the free end of the arm toward the central axis.

During sputter processing, the two magnetrons adjoin at paired ends and form one linearly extending open-loop magnetron in an outer portion of the target. During cleaning, at least a portion of one magnetron is moved inwardly so as to clean an inner portion of the target not scanned by the stationary magnetron while the stationary magnetron continues to sputter and clean the outer portion of the target.

DETAILED DESCRIPTION OF THE PREFERRED EMBODIMENTS

The invention modifies a conventional magnetron sputter chamber to include a magnetron having a portion switchable between two radial positions relative to a center of rotation of the magnetron.

Figure 1:
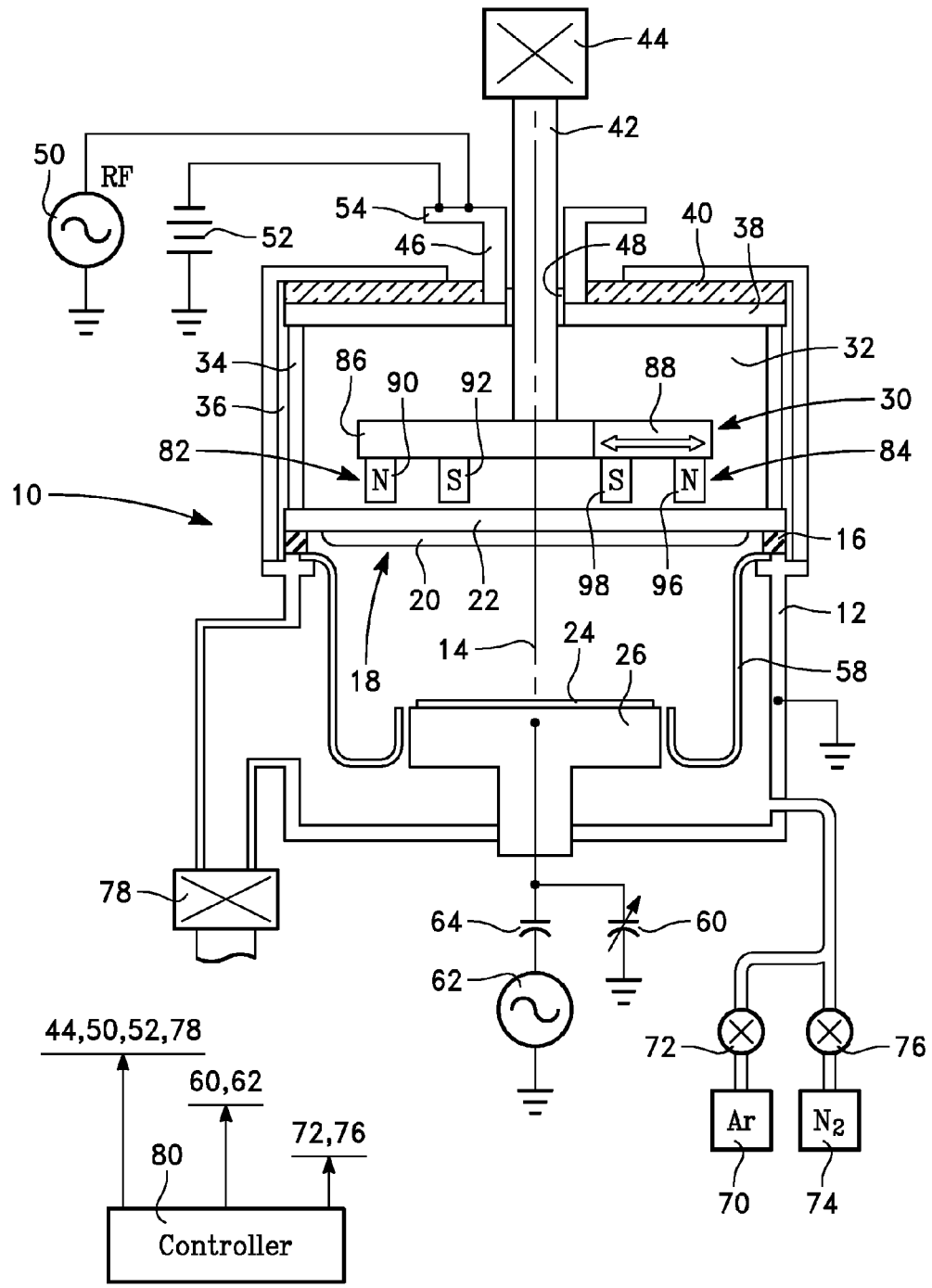
FIG. 1 is a cross-sectional view of a plasma sputter chamber incorporating a dual-position magnetron of the invention.

A PVD (physical vapor deposition) or sputter chamber 10 is illustrated schematically in cross section in FIG. 1. The illustration is based upon the Avenir RF PVD sputter system available from Applied Materials, Inc. of Santa Clara, Calif., more details of which are disclosed by Wang et al. in US patent application publication 2011/0311735, incorporated herein by reference. The sputter chamber 10 includes a vacuum chamber wall 12 arranged around a central axis 14 and sealed through a ceramic isolator 16 to a target assembly 18. For some common metals, the target assembly 18 may be entirely composed of the metal to be sputtered, but for other metals, especially those of low electrical conductivity, and for dielectrics, the target assembly 18 includes a target 20 of the sputter material bonded to a conductive metal backing plate 22. The sputter material is to be sputter deposited on a wafer 24 or other substrate held on a heater electrode pedestal 26 by an electrostatic chuck or an unillustrated wafer clamp in opposition to the target assembly 18.

The target material is sputtered by a plasma generated within the vacuum chamber wall 12 in the volume between the target 20 and the wafer 24. The plasma is enhanced and localized by a magnetron system 30, to be discussed in more detail below, which is disposed in back of the target assembly 18 in a magnetron chamber 32 filled with a recirculating cooling fluid, such as water, to cool the target assembly 18 as it is heated by the plasma. The magnetron chamber 32 is defined on its sides by a conductive inner magnetron chamber side wall 34 sealed to and electrically connected to the target assembly 18 and electrically isolated from the upper portion of the grounded vacuum chamber wall 12 by an electrically isolating gap 36. The top of the magnetron chamber 32 is defined by a conductive magnetron chamber top wall 38 fixed to the magnetron chamber side wall 34 and isolated from the top of the vacuum chamber wall 12 by a dielectric member 40. The magnetron 30 is rotated about the central axis 14 by a rotary shaft 42 extending along the central axis 14 and driven by a motor 44. A shaft collar 46 sealed to the magnetron chamber top wall 38 freely accommodates the rotary shaft 42 with an insulating gap between them. A insulating rotary seal 48 between the rotary shaft 42 and the magnetron chamber top wall 38 and the shaft collar 46 allows the shaft 42 to rotate while sealing in the cooling water and electrically isolating the shaft 42 from the shaft collar 46 and the magnetron chamber walls 34, 38. An unillustrated magnetic coil may be wrapped around the vacuum chamber wall 12 slightly above the pedestal 26 to guide sputter ions towards the wafer 24. For large targets, it may be advantageous to incorporate the liquid cooling into the backing plate 22 and to vacuum pump the magnetron chamber 32 to a sufficiently low pressure to reduce the differential pressure across the relatively thin target assembly 18.

In this embodiment, the plasma is generated primarily by power applied to the target assembly 18 by an RF source power supply 50 and by power applied by an optional negative DC source power supply 52. An unillustrated electrical coupling circuit is connected between the source power supplies 50, 52 and a flange 54 of the shaft collar 46 and hence to the magnetron chamber walls 34, 38 and the target assembly 18. An electrically grounded shield 58 fixed to the grounded chamber wall 12 protects the walls of the vacuum chamber 12 from the sputtered material and provides the anode grounding plane for the plasma.

The optional DC power supply 52 is selectable and controllable to negatively bias the target assembly with respect to the shield 58. The RF power supply 50 may operate, for example, in the range of 2 to 60 MHz and above, of which the frequencies 2 MHz, 13.56 MHz, 27 MHz, 40.68 MHz and 60 MHz are preferred because of relaxed interference requirements. More preferably, the RF power is VHF, that is, greater than 40 MHz with an upper limit of, for example, 250 MHz. Multiple RF frequencies may be combined. The shaft collar 46 and magnetron chamber walls 34, 36 are coaxial about the central axis 14 to promote even distribution of VHF power to the large target assembly 18.

The pedestal 26 and hence the wafer 24 may be left electrically floating or may be connected to ground through a capacitive tuning circuit 60, but for some types of sputtering an RF bias power supply 62, for example at 2, 13.56 or 27 MHz, is coupled to the pedestal 26 through an AC capacitive coupling circuit 64 or more complex matching and isolation circuitry to allow the electrode pedestal 26 to develop a negative DC self-bias voltage, which attracts deep into high aspect-ratio holes positively charged sputter ions created in a high-density plasma. Even when the pedestal 26 is left electrically floating or capacitively coupled to ground, it develops some negative DC self-bias.

A sputter gas source 70 supplies a sputtering working gas, typically argon, to the vacuum chamber 12 through a mass flow controller 72. In some applications, a reactive gas such as nitrogen or oxygen, may be supplied from reactive gas source 74 through its mass flow controller 76 to reactively sputter deposit a nitride or oxide of the target metal. The gases penetrate through an aperture at the bottom of the shield 58 or through a gap formed between the pedestal 26 and the shield 58. A vacuum pumping system 78 connected to the vacuum chamber 12 through a wide pumping port maintains the interior of the chamber 12 at a low pressure. Although the base pressure can be held to about $10^{-7}$ Torr or even lower, the pressure of the argon working gas during RF sputtering may be maintained at between about 1 to 200 mTorr. A controller 80 controls the gas mass flow controllers 72, 76, the vacuum pump 78, the magnetron rotary motor 44, and the power supplies 50, 52, 62 according to the recipe for the process.

When the argon is admitted into the chamber, the voltage between the target assembly 18 and the shield 58 ignites the argon into a plasma. The positively charged argon ions excited in the plasma are attracted to the negatively biased target assembly 18 and are accelerated to a substantial energy sufficient that when striking the target 20 they cause target atoms to be sputtered from the target 20. Some of the target particles strike the wafer 24 and are thereby deposited on it, thereby forming a film of the target material.

To provide efficient sputtering, the magnetron system 30 is positioned in back of the target assembly 18 to create a magnetic field inside the vacuum chamber adjacent the sputtering surface of the target 20. The magnetic field can trap electrons and also hence ions to thereby increase the plasma density and to thereby also increase the sputtering rate. According to one embodiment of the invention, the magnetron system 30 includes a radially stationary magnetron 82 and a movable magnetron 84 both supported at different azimuthal positions of a rotation plate assembly 86 relative to the central axis 14 of the chamber 10. The rotation plate assembly 86 is fixed to the rotary shaft 42 to thereby rotate both magnetrons 82, 84 about the central axis 14. However, the rotation plate assembly 86 includes a radial movement section 88 which directly supports the radially movable magnetron 84 and can selectively move radially to allow the radial positioning of the movable magnetron 84 apart from its azimuthal rotation. In one described embodiment, in one selectable configuration, the two magnetrons 82, 84 form one linearly extending magnetron; in a second selectable configuration, the two magnetrons 82, 84 are disjoint and scan different radial portions of the target.

In this embodiment, the rotation plate assembly 86 is formed of ferromagnetic material which supports and magnetically couples an outer stationary pole 90 of a first magnetic polarity and an adjacent inner stationary pole 92 of an opposed second magnetic polarity with a gap between them. The radially stationary magnetron 82 is fixed to the rotation plate assembly 86 at a fixed, first radial position. The magnetic field extending between the two stationary poles 90, 92 creates a source high-density plasma region adjacent a first portion of the sputtering face of the target 20. Similarly, the radial movement section 88 is formed of a ferromagnetic material and supports and magnetically couples an outer movable pole 96 of the first magnetic polarity and an inner movable pole 98 of the second magnetic polarity to form the radially movable magnetron 84 at a variable, second radial position. The magnetic field extending between the two movable poles 96, 98 creates another high-density plasma region adjacent a second portion of the sputtering face of the target 20. As will be explained later for the preferred operation sequence, during deposition, the fixed and movable magnetrons 82, 84 azimuthally extend over a significant azimuthal angle and abut each other in radial positions such that the stationary magnetron 82 and the movable 84 magnetron are aligned with each other, though along a truncated spiral path. As a result, the plasma regions they generate are continuous with each other and produce a continuous sputtering pattern of the target 20. However, during cleaning, the movable magnetron 84 moves to another radius and the two magnetrons 82, 84 and their plasma regions effectively separate to scan different radial portions of the target 20.

Figure 2:
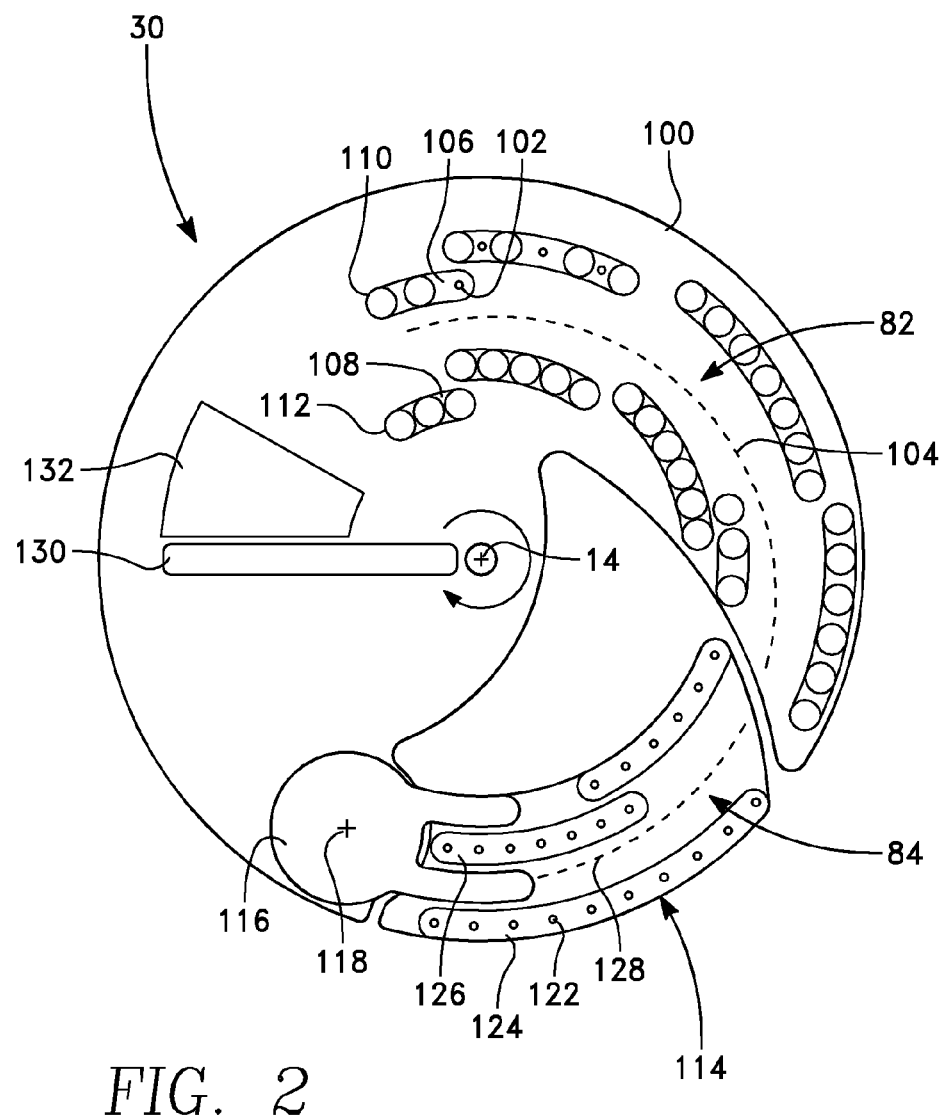
FIG. 2 is a partially schematic bottom plan view of the magnetron system in its extended processing configuration.

The magnetron system 30 is illustrated in more detail in its process configuration in the partially schematic bottom plan view of FIG. 2. It includes a generally disc-shaped ferromagnetic rotation plate 100 fixed at its center to the rotary shaft 42 at the central axis 14. The rotation plate 100 directly supports the stationary magnetron 82. A series of centering or capture holes 102 are machined into the rotation plate 100 to capture centering pins at the ends of cylindrical permanent magnets which can be positioned selectively in the capture holes 102. The capture holes 102 are drilled in generally complementary sets on either side of a stationary central track 104 that follows an inward spiral. Ferromagnetic pole faces 106, 108 for the inner and outer stationary poles 90, 92 are formed as arc segments with corresponding capture holes and geographically define the stationary poles 90, 92. Cylindrical permanent magnets 110 are positioned in the capture holes 102 of the outer pole faces 106 with a vertical orientation of a first magnetic polarity; similar magnets 112 are positioned in the capture holes 102 of the inner pole faces 108 with the opposed vertical orientation of the second magnetic polarity. The pole faces 106, 108 are then positioned over the magnets using the pole face capture holes and secured by non-magnetic screws to the rotation plate 100 to thereby form the two magnetically coupled opposed stationary poles 90, 92. The stationary magnetron 82 is formed with a narrowing gap on the inner portions of the spiral. The separate poles are formed in short arc-shaped segments with nearly constant gap between the poles in each segment. Such a segmented design facilitates optimization of the different portions of the magnetron especially for ignition of the plasma. Because of the overlapping and segmented poles, the stationary central track 104 is not necessarily equidistant from the pairs of pole faces 106, 108 but follows a generally smooth track marking the maximum of the confined plasma track.

The rotation plate 90 is formed with a large recess to accommodate the movable magnetron 84, which includes an arc-shaped swivel arm 114. A freely rotating pivot mechanism 116 is supported on the rotation plate 82 and rotatably supports the swivel 114 arm at its end opposite the stationary magnetron 82 to rotate about a pivot axis 118. The swivel arm 114 may have similar thickness and ferromagnetic property as the rotation plate 100 to thus act as a magnetic yoke for its movable magnetron 84. It is formed with similar pairs of capture holes 122 and similar pole faces 124, 126 to those of the stationary magnetron 82. Unillustrated magnets are captured between the pole faces 124, 126 and the swivel arm 114 on either side of a central movable track 128 similarly to the relative polarities achieved in the stationary magnetron 82 to thereby form the movable poles 96, 98. The magnets may uniformly fill the illustrated capture holes 122.

The process configuration of FIG. 2 creates a combined arc-shaped magnetron having open ends. Such a configuration contrasts with the closed-loop magnetrons promoted by Rosenstein and Miller, who emphasized a small dense plasma. With RF sputtering using a relatively large, open-ended magnetron, the plasma leaks out of the magnetron and covers a large area and volume adjacent the target. The large volume or depth of the plasma results in a higher metal ion flux as neutral sputtered atoms traverse the large plasma. High metal fluxes provide good bottom coverage for holes, such as vias, having increasingly higher aspect ratios as the IC feature sizes continue to shrink. The combination of the stationary and movable magnetrons 82, 84 extends over an azimuthal range about the central axis of at least 90° and preferably greater than 180° in order to provide a long magnetron. The azimuthal range is preferably no more than 270° to provide the leaky open ends of the combined magnetron.

An auxiliary set of magnets may be optionally positioned in a stem pole 130 extending generally radially away from a middle of the two spirally arranged magnetrons 82, 84 and directly supported on the rotation plate 100. A counterweight 132 balances the weight of the magnets to promote smoother rotation.

The pivot mechanism 116 pivots about the pivot axis 118 disposed toward the outer periphery of the rotation plate 100 preferably at a radius between the poles of the movable magnetron 84 adjacent the pivot mechanism 116. When the controller 80 instructs the motor 44 to rotate the rotation plate 100 in the clockwise (CW) direction illustrated in FIG. 2, centrifugal force causes the swivel arm 114 to pivot toward the illustrated outer, process position. A mechanical stop is provided by the contact of the adjacent outer peripheral portions of the rotation plate 100 and the swivel arm 114. In this position, the two central tracks 104, 128 line up to form a continuous track having a generally spiral shape. The resultant plasmas form a continuous plasma track extending in the same spiral shape from the outer periphery of the target 20 part way toward the center 14 of the target 20.

Figure 3:
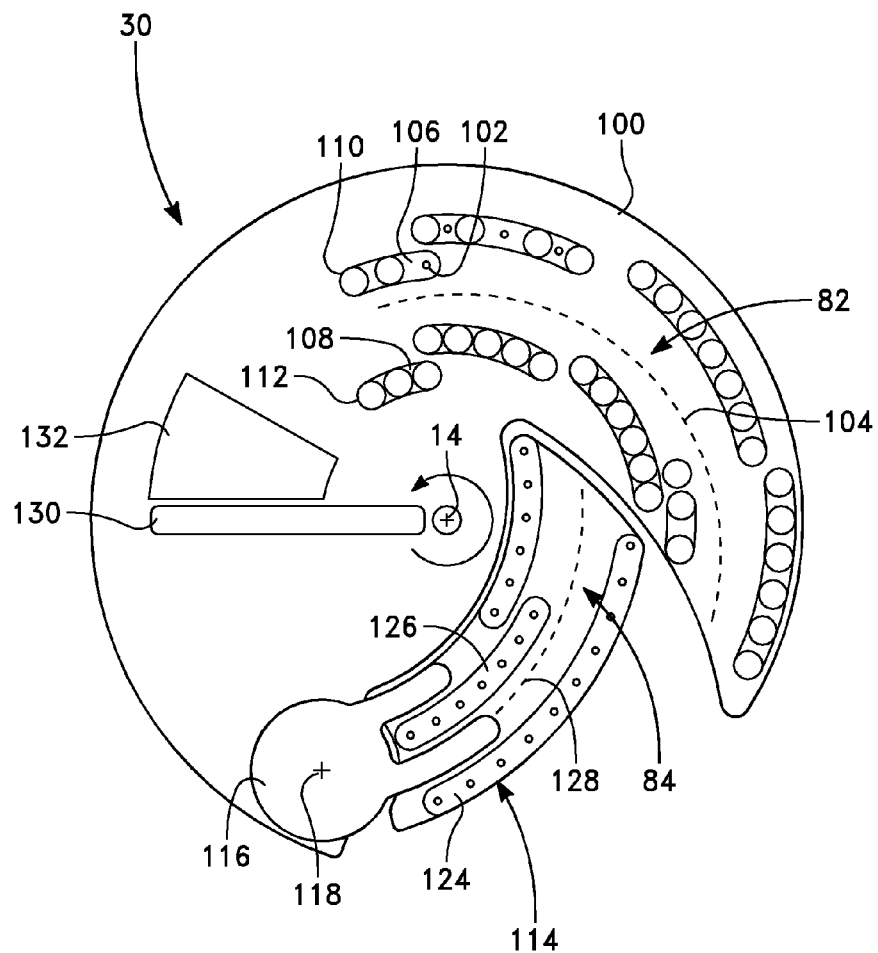
FIG. 3 is a bottom plan view of the magnetron system of FIG. 2 in its retracted cleaning configuration.

The magnetron system 30 is illustrated in its cleaning configuration in FIG. 3. When the controller 80 instructs the motor 44 to rotate the rotation plate 100 in the counter-clockwise (CCW) direction, the swivel arm 114 pivots inwardly, assuming its center of mass is radially closer to the rotation axis 14 than is the pivot axis 118. As a result, the end of the movable magnetron 84 closest to the stationary magnetron 82 moves towards the rotation axis 14. The complementarily curved sides of rotation plate 100 and the swing arm 114 may be used as an inner swing stop. The free end of the movable magnetron 84 then scans over an inner portion of the target 20 not scanned during the process configuration of FIG. 2 while the stationary magnetron 82 continues to scan the process sputtering track 104. Also, the two tracks 104, 128 separate during the cleaning phase and the plasmas also separate.

The invention is not limited to the described embodiment. In an alternative embodiment, the pivot axis 118 is located close to an end of the stationary magnetron 82 and the movable magnetron extends away from both the pivot axis 118 and the stationary magnetron 82 toward its free end. As a result, the radially stationary end of the movable magnetron 84 may be designed to continue to be adjacent to the stationary magnetron 82. Thus, even in the cleaning configuration with the other end of the movable magnetron 84 moved toward the central axis 14, a single plasma track is formed.

The magnets need not be of the same strength but may be tailored for optimal performance along the length of the combined magnetron. The described embodiment is based on balanced magnetrons having equal magnetic intensity of opposed polarities on the opposed sides about the magnetron tracks. However, unbalanced magnetron may be useful in which one side is stronger than the other. Thereby, the excess magnetic field tends to project away from the magnetrons toward the wafer to thereby guide ionized sputter particles toward the wafer.

The switching mechanism of the described embodiment relies upon reversing the rotation direction of the dual magnetron about the central axis and thus reversing the direction of the centrifugal force about the pivot axis. Miller et al. in U.S. Pat. No. 7,736,473 describe a centrifugal mechanism which is spring biased opposite the centrifugal force. By varying the speed of rotation in a single direction, the biasing or centrifugal force predominates and thus determines the radial positions of the magnetron. Miller et al. also describe more sophisticated stops and counterweights for the movable magnetron. Miller et al. in U.S. Pat. No. 8,021,527 describe a coaxial drive shaft which can actively vary the radial position of a magnetron as well as rotate it about the central axis.

It has been found that the uniformity of sputter deposition from such a magnetron is improved if during deposition the two magnetrons 82, 84 are positioned toward a radially outer portion of the target 20 since the ion diffusion and the magnetic guiding field tend to push the sputter ions towards the central axis 14. During the production deposition phase with a production wafer 24 supported on the pedestal 26, both the stationary and movable magnetrons 82, 84 are positioned toward the outer periphery of the target 20. However, if the principal sputtering is occurring in an outer circumferential band of the target 20, some of the sputtered target atoms are likely to redeposit on inner portions of the target 20 radially inside of the sputtered annular band. Because there is very little sputtering otherwise occurring away from the magnetrons 82, 84 during deposition, the redeposited material is likely to build up into a thickening layer of loosely bonded material. Further, the redeposited material tends to be highly stressed and prone to cracking. If the redeposited film grows sufficiently thick, it is likely to flake off and create significant particles, thereby degrading the quality of the film deposited on the wafer 24 and any semiconductor devices formed near the particles falling from the middle of the target 20.

Accordingly, during a cleaning phase the movable magnetron 84 is moved radially inwardly to scan an inner portion of the target not scanned by the stationary magnetron 82 or scanned by the movable magnetron 84 during the sputtering phase. Typically, no production wafer is placed on the pedestal 26 during the cleaning phase although a dummy or sacrificial wafer may be placed there to protect the pedestal 26. Otherwise, the process conditions during cleaning may be the same as during process sputtering but no reactive gas need be used.

In the previously cited publication Allen et al. disclose an open-ended, arc-shaped magnetron which can be pivoted about a peripheral pivot from a circumferential process configuration to cleaning configuration extending inwardly from the periphery across a portion of the inner part of the target. The two-part magnetron of the present invention offers several advantages over the Allen design. The present linear magnetron extends over greater than 180° of azimuth in order to increase the active magnetron length. Allen's smaller linear magnetron extends over no more than about 165° and it would be difficult to swing an entire longer magnetron within the outline of the target. The stationary magnetron of the present invention remains over its process sputtering track during the cleaning phase. As a result, the stationary magnetron prevents any redeposited sputter material cleaned from the target center by the inwardly moved movable magnetron from redepositing a second time in the important process sputtering track.

The cleaning of the otherwise unsputtered portion of the target prevents the buildup of redeposited material, which tends to flake off and produce deleterious particles. Thereby, the life of a target can be extended before particle production becomes an unacceptable problem. The stationary magnetron is positioned in the normally sputtered portion of the target during the cleaning to thereby prevent secondary redeposition there during the cleaning phase. That is, substantially all of the target is magnetically scanned and sputtered during the cleaning phase.

The described magnetron is useful for sputtering conventional highly conductive metallization materials such as aluminum and copper. It becomes more beneficial for sputtering the less conductive refractory materials such as titanium, tantalum, and tungsten from targets of such materials. It is particularly beneficial in sputtering silicon. Silicon easily oxidizes and its redeposited form differs greatly from the form used in the target and is highly prone to flaking. The invention is also beneficially used in reactive sputtering of nitrides and oxides such as silicon nitride, titanium nitride, silicon oxide, and aluminum oxide. RF sputtering using the magnetron of the invention may be advantageously applied to sputtering of dielectric targets such as $Al_2O_3$, $Si_3N_4$, and $SiO_2$.

The dual magnetron having both a radially stationary magnetron and a radially movable magnetron is particularly advantageous for RF sputtering in which the combined magnetrons in the long linear process configuration provide efficient RF sputtering and in the disjointed cleaning configuration assure cleaning of the entire sputtering face of the target. However, the dual, partially movable magnetron of the invention is not limited to this use or to cleaning of the central portion of the target.

The described magnetron is beneficial at both efficient RF sputtering and at periodically cleaning the target to thereby reduce harmful particulates and to extend the useful life of the target. Nonetheless, the mechanism is simple and does not greatly interfere with processing.

The invention claimed is:

1. A dual magnetron for use in a plasma sputtering chamber, comprising:
   a rotation member rotatable about a central axis;
   a first magnetron mounted on the rotation member, linearly extending along a first track, comprising a first pole of a first magnetic polarity disposed on a first side of the first track and a second pole of an opposed second magnetic polarity disposed on an opposed second side of the first track closer to the central axis than the first side, and having open ends on the ends of the first track;
   a pivot arm pivoting about a pivot axis on a periphery of the rotation member between a first position displaced from the central axis and a second position closer to the central axis than the first position; and
   a second magnetron mounted on the pivot arm, linearly extending along a second track, comprising a second pole of the first magnetic polarity disposed on a third side of the second track and a third pole of the second magnetic polarity disposed on an opposed fourth side of the second track closer to the central axis than the third side, the second magnetron having open ends on the ends of the second track;
   wherein the second track is aligned with the first track when the pivot arm is in the first position and extends closer to the central axis when the pivot arm is in the second position.

2. The dual magnetron of claim 1, wherein the first track follows an inward spiral toward the central axis.

3. The dual magnetron of claim 1, wherein the second magnetron, while the pivot arm is in the first position, is no closer to the central axis than any linear part of the first magnetron.

4. The dual magnetron of claim 1, wherein the first and second magnetrons extend over an azimuthal range about the central axis of between 90° and 270° while the pivot arm is in the first position.

5. The dual magnetron of claim 4, wherein the azimuthal range is greater than 180°.

6. The dual magnetron of claim 1, wherein the first and third magnetic poles comprise respective pluralities of first magnets of the first magnetic polarity and the second and fourth magnetic poles comprise respective pluralities of second magnets of the second magnetic polarity and wherein the rotation member and the pivot arm comprise ferromagnetic members and further comprising a plurality of ferromagnetic pole faces capturing the first and second magnets to the rotation member and the pivot arm which act as magnetic yokes between the first and second magnets.

7. The dual magnetron of claim 1, further comprising:
   a vacuum chamber arranged about the central axis;
   a pedestal within the vacuum chamber for supporting a substrate to be sputter deposited;
   a target assembly including a target surface and sealed to the vacuum chamber in opposition to the pedestal, wherein the dual magnetron of claim 1 is positioned on a side of the target assembly opposite the pedestal;
   a rotary shaft extending along the central axis and supporting the dual magnetron of claim 1; and
   an RF power supply electrically connected to the target assembly.

8. A dual magnetron, comprising:
   a rotation member configured to be rotated about a central axis;
   a first magnetron fixed to the rotation member and comprising a first outer pole of a first magnetic polarity and a first inner pole of an second magnetic polarity opposite the first magnetic polarity and disposed closer to the central axis than the first outer pole and separated from the first outer pole by a first gap, wherein the first magnetron has a magnetic configuration arranged along a first open-loop track;
   an arm movable about the rotation member between a first radial position and a second radial position less than the first radial position with respect to the central axis; and
   a second magnetron fixed to the arm and comprising a second outer pole of the first magnetic polarity and second inner pole of the second magnetic polarity and disposed closer to the central axis in the first radial position of the arm than the second outer pole and separated from the second outer pole by a second gap, wherein the second magnetron has a magnetic configuration arranged along a second open-loop track;
   wherein, in the first radial position of the arm, an end of the first open-loop track adjoins an end of the second open-loop track.

9. The dual magnetron of claim 8, wherein, in the second radial position of the arm, the end of the second open-loop track is farther away from the end of the first open-loop track than in the first radial position of the arm.

10. The dual magnetron of claim 8, wherein the arm is rotatably mounted on the rotation member and pivots about a pivot axis on the rotation member.

11. The dual magnetron of claim 10, wherein the second magnetron extends over a length between a pivoting end of the arm and a free end of the arm.

12. The dual magnetron of claim 8, wherein centrifugal force is varied according to the rotation of the rotation member about the central axis to at least partially cause the arm to move between the first and second radial positions.

13. The dual magnetron of claim 8, further comprising:
   a vacuum chamber arranged about the central axis;
   a pedestal within the vacuum chamber for supporting a substrate to be sputter deposited;
   a target assembly including a target surface and sealed to the vacuum chamber in opposition to the pedestal, wherein the dual magnetron of claim 8 is positioned on a side of the target assembly opposite the pedestal;
   a rotary shaft extending along the central axis and fixed to the rotation member; and
   an RF power supply electrically connected to the target assembly.

14. A method of plasma sputtering, comprising the steps of:
   exciting a plasma in a vacuum chamber arranged about a central axis and including a pedestal for supporting a substrate and a target disposed in opposition to the pedestal;
   a first step of rotating about the central axis a dual magnetron on a back side of the target opposite the pedestal including rotating an open-ended first magnetron having opposed first magnetic poles separated by a first gap at a first radius from the central axis to thereby scan the first magnetron over an outer region of the target; and
   a second step of rotating including
      during a first phase, rotating about the central axis an open-ended second magnetron of the dual magnetron and having opposed second magnetic poles separated by a second gap at a radius that overlaps the scanning of the first magnetron to thereby scan the second magnetron over at least a portion of the outer region, and during a second phase, rotating the second magnetron about the central axis at a radius that causes the second magnetron to scan a portion of the target radially inwardly from the outer region.

15. The method of claim 14, further including abutting a first open end of the first magnetron with a second open end of the second magnetron during the first phase.

16. The method of claim 15, further including moving the first open end away from the second open end during the second phase.

17. The method of claim 14, wherein the first phase is a production phase with a production substrate supported on the pedestal and wherein the second phase is a cleaning phase with no production substrate supported on the pedestal.

18. The method of claim 14, further comprising applying to the target RF power having a frequency of at least 2 MHz to thereby excite plasmas adjacent the first and second magnetrons in a volume between the target and the pedestal.

19. The dual magnetron of claim 1, further comprising:
a target assembly including a target surface to be sputtered, wherein the dual magnetron of claim 1 is positioned on a side of the target assembly opposite the target surface; and an RF power supply having a frequency of at least 2 MHz and connected to the target assembly.

\* \* \* \* \*